(12) United States Patent
Yang et al.

(10) Patent No.: US 9,757,848 B2
(45) Date of Patent: Sep. 12, 2017

(54) DETACHING EQUIPMENT FOR DETACHING ELECTRONIC DEVICE AND DETACHING METHOD THEREOF

(71) Applicant: PEGATRON CORPORATION, Taipei (TW)

(72) Inventors: Chun-Hou Yang, Taipei (TW); Chih-Ming Hsu, Taipei (TW)

(73) Assignee: PEGATRON CORPORATION, Taipei (TW)

(*) Notice: Subject to any disclaimer, the term of this patent is extended or adjusted under 35 U.S.C. 154(b) by 208 days.

(21) Appl. No.: 14/883,459

(22) Filed: Oct. 14, 2015

(65) Prior Publication Data

US 2016/0113163 A1  Apr. 21, 2016

(30) Foreign Application Priority Data

Oct. 15, 2014 (CN) .......................... 2014 1 0544578

(51) Int. Cl.
*B23P 19/00* (2006.01)
*B25B 27/00* (2006.01)
*H05K 13/04* (2006.01)
*B25B 5/12* (2006.01)
*B25B 11/02* (2006.01)
*B25B 27/14* (2006.01)

(52) U.S. Cl.
CPC ................ *B25B 27/00* (2013.01); *B25B 5/12* (2013.01); *B25B 5/127* (2013.01); *B25B 11/02* (2013.01); *B25B 27/14* (2013.01); *H05K 13/0486* (2013.01)

(58) Field of Classification Search
CPC .. H05K 13/0007; H05K 13/0486; B25B 5/12; B25B 5/127; B25B 11/02; B25B 27/00; B25B 27/14
See application file for complete search history.

(56) References Cited

U.S. PATENT DOCUMENTS 3,579,795 A * 5/1971 Burman ............. H05K 13/0491
219/230
5,726,859 A * 3/1998 Khadem ................ H05K 3/301
257/727
6,381,821 B1 * 5/2002 Panyon, Jr. ............. B05B 1/202
137/318

(Continued)

FOREIGN PATENT DOCUMENTS

CN           2768382 Y      3/2006

*Primary Examiner* — Paul D Kim
(74) *Attorney, Agent, or Firm* — Muncy, Geissler, Olds & Lowe, P.C.

(57) ABSTRACT

The present invention relates to detaching equipment for detaching an electronic device and a detaching method thereof. A base of the detaching equipment comprises a bearing groove for bearing the electronic device. The first fixing unit and the second fixing unit are disposed at the base. A fixing member of the first fixing unit is capable of moving along a first direction to fix a housing of the electronic device. A protruding portion of the fixing member faces the bearing groove. A baffle of the second fixing unit moves along a second direction to be inserted between a motherboard and a battery unit. At least one lifting portion of a pry bar is provided with an arc. The arc of the lifting portion fits the battery unit of the electronic device, and the pry bar abuts against the protruding portion to lift and detach the battery unit.

8 Claims, 8 Drawing Sheets

(56) References Cited

U.S. PATENT DOCUMENTS

| | | | |
|---|---|---|---|
| 9,578,794 B2 * | 2/2017 | Bielick | H05K 13/0486 |
| 2010/0224661 A1 * | 9/2010 | Egan | B60R 11/02 224/413 |

* cited by examiner

DETACHING EQUIPMENT FOR DETACHING ELECTRONIC DEVICE AND DETACHING METHOD THEREOF

CROSS REFERENCE TO RELATED APPLICATIONS

This application claims the priority benefits of China Patent Application No. 201410544578.3, filed on Oct. 15, 2014. The entirety of the above-mentioned patent applications are hereby incorporated by references herein and made a part of specification.

BACKGROUND

Technical Field

This disclosure relates to equipment and a detaching method thereof, and more particularly, to detaching equipment for detaching an electronic device and a detaching method thereof.

Related Art

When the electronic device, such as cell phone, tablet, notebook or wearable device, needs to change the component inside or to detect during using, a detaching process with multiple steps is necessary. If it needs to detach and exchange a battery unit of the electronic device, for example, the typical method is to hold the housing in one hand and to use a pry bar to pry the battery unit in the other hand. Note that the housing is held during the prying process and the inner wall of the housing is used as a fulcrum for fixing so as to separate the battery unit from the substrate or the bearing groove. However, the above method not only puts a lot of efforts but also easily bends the battery unit and the housing during the forcing process of the pry bar thus to damage the battery, the housing or other circuit components.

For this reason, how to offer detaching equipment for quickly detaching the electronic device without the damage of the battery, the internal components or the housing during the detaching process and a detaching method thereof is an important issue for the engineer figuring out the solution in this field.

SUMMARY

According to the abovementioned object, an aspect of the present invention is to provide equipment and a detaching method thereof, and more particularly, to detaching equipment for detaching an electronic device and a detaching method thereof.

To achieve the above purpose, the present invention provides a detaching equipment for detaching an electronic device. The electronic device comprises a housing, a motherboard and a battery unit. In addition, the motherboard and the battery unit are disposed in parallel in a receiving space of the housing. The detaching equipment comprises a base, a first fixing unit, a second fixing unit and a pry bar.

The base has a bearing groove for bearing the electronic device. The first fixing unit and the second fixing unit are disposed at the base. The first fixing unit comprises a fixing member capable of moving along a first direction to fix the housing of the electronic device. The fixing member has a protruding portion facing the bearing groove and the protruding portion partially covers the housing of the electronic device when the fixing member fixes the housing of the electronic device. The second fixing unit comprises a baffle capable of moving along a second direction to be inserted between the motherboard and the battery unit, in which the second direction is perpendicular to the first direction. The pry bar comprising at least one lifting portion with an arc. When the at least one lifting portion enters the receiving space, the arc of the at least one lifting portion fits the battery unit of the electronic device. The pry bar abuts against the protruding portion to allow the at least one lifting portion to lift and detach the battery unit.

In an embodiment of the present invention, the second fixing unit further comprises a transmission member and a buffering member disposed at the transmission member in which the buffering member is disposed between the motherboard and the transmission member when the baffle is inserted between the motherboard and the battery unit.

In an embodiment of the present invention, the second fixing unit further comprises a connecting member passing through the transmission member and the buffering member.

In an embodiment of the present invention, the second fixing unit further comprises a pushing member and the connecting member passes through the pushing member to allow the transmission member to drive the connecting member, the pushing member and the buffering member to move along the second direction.

In an embodiment of the present invention, the buffering member is an elastic member.

In an embodiment of the present invention, the base further comprises at least one positioning member and the positioning member is disposed at the base and passes through the transmission member to allow the transmission member to move along the positioning member in the second direction.

In an embodiment of the present invention, the at least one positioning member can be two positioning members passing through, respectively, the two sides of the transmission member.

To achieve the above purpose, the present invention provides a detaching method for detaching an electronic device. The electronic device comprises a housing, a motherboard and a battery unit in which the battery unit and the motherboard are disposed in parallel in a receiving space of the housing.

The detaching method comprises following steps of: disposing the electronic device at a bearing groove of a detaching equipment; moving a fixing member of a first fixing unit of the detaching equipment along a first direction to allow the fixing member to fix the housing of the electronic device and a protruding portion of the fixing member of the first fixing unit to be disposed at the housing of the electronic device; moving a baffle of a second fixing unit of the detaching equipment along a second direction to allow the baffle of the second fixing unit to be inserted between the motherboard and the battery unit of the electronic device in which the second direction is perpendicular to the first direction; providing a pry bar comprising at least one lifting portion with an arc; allowing the at least one lifting portion to enter the receiving space, wherein the arc of the at least one lifting portion fits the battery unit of the electronic device; and abutting against the protruding portion by the pry bar to allow the at least one lifting portion to lift and detach the battery unit.

Accordingly, the present invention allows the electronic device to be fixed in the bearing groove of the base through the first fixing unit and utilizes the protruding portion of the fixing member of the first fixing unit to partially cover the housing of the electronic device for avoiding the housing from the damage caused by the pry bar during the detaching process. In addition, the present invention further utilizes the baffle to avoid the motherboard from the impact caused by the pry bar when the pry bar lifts and detaches the battery unit. Thus, the present invention is able to provide detaching equipment for quickly detaching the electronic device without the damage of the battery, the internal members or the housing of the electronic device and a detaching method for detaching the electronic device.

DETAILED DESCRIPTION OF THE INVENTION

Figure 1A:
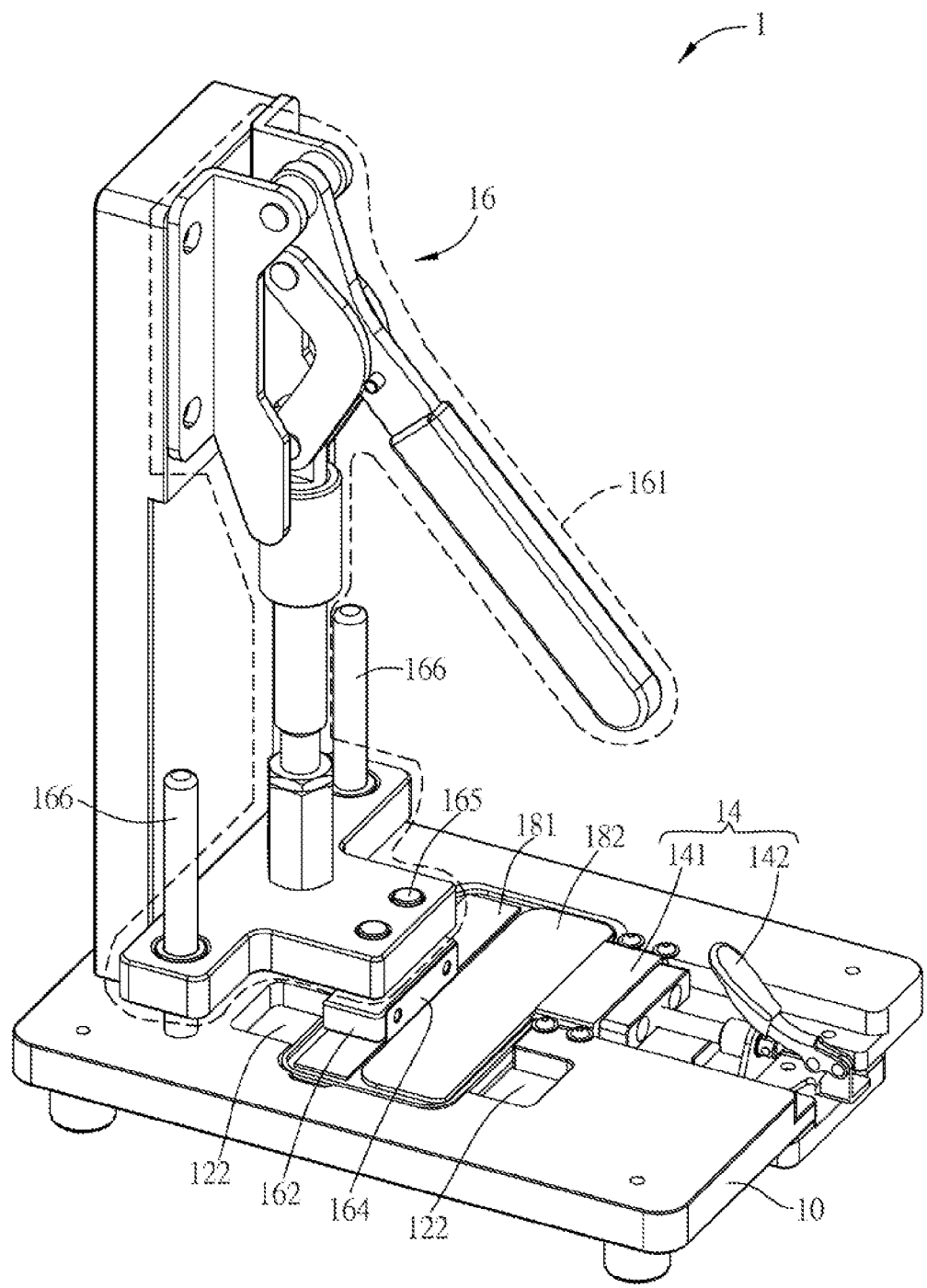
FIG. 1A is a perspective schematic view showing a detaching equipment according to an embodiment of the present invention.

The following drawings disclose a detaching equipment according to a preferred embodiment of the present invention, in which the same elements will be described with the same reference numerals.

Figure 1B:
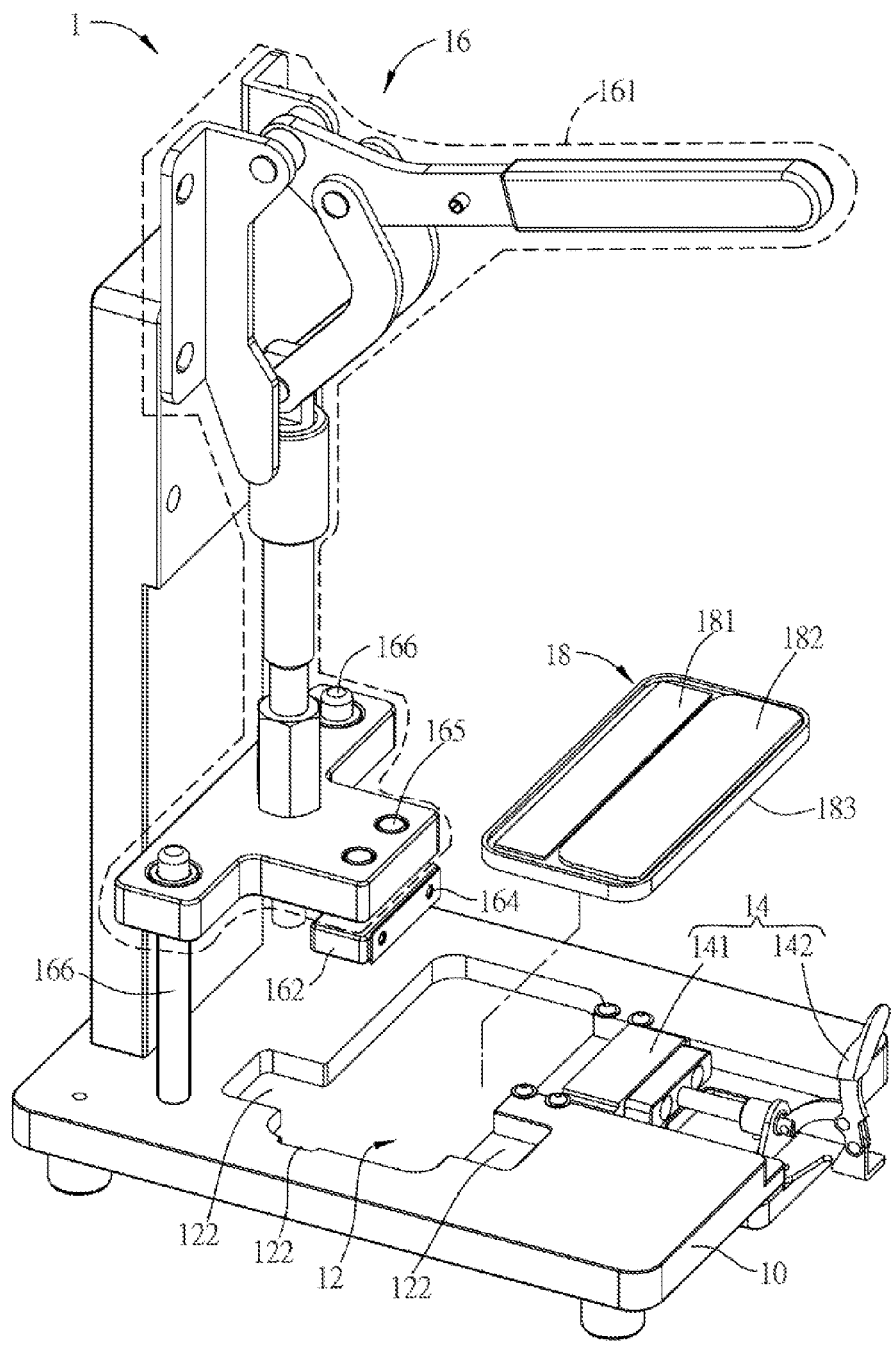
FIG. 1B is another perspective schematic view showing a detaching equipment according to an embodiment of the present invention.
Figure 2A:
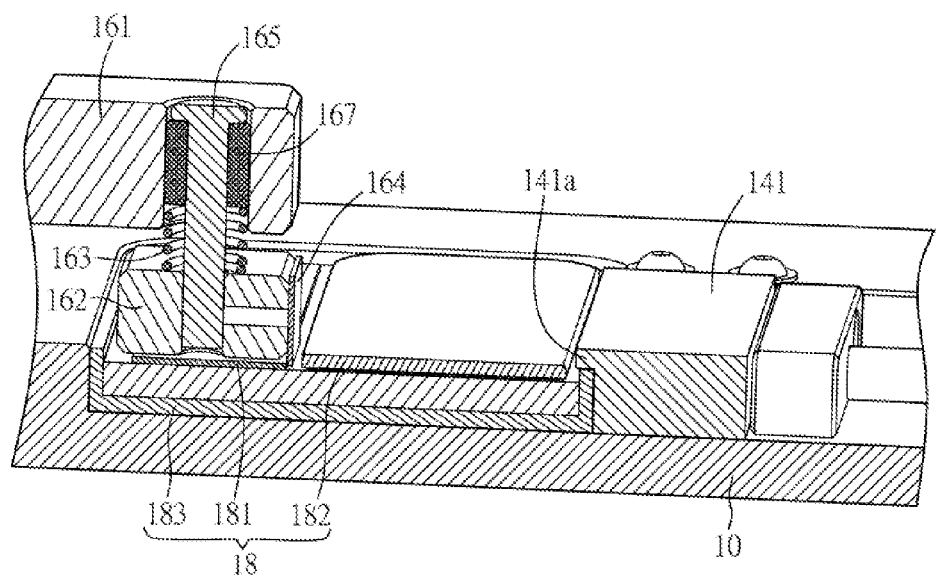
FIG. 2A-2B are partially enlarged cross-sectional drawings showing the detaching equipment in FIG. 1.
Figure 2B:
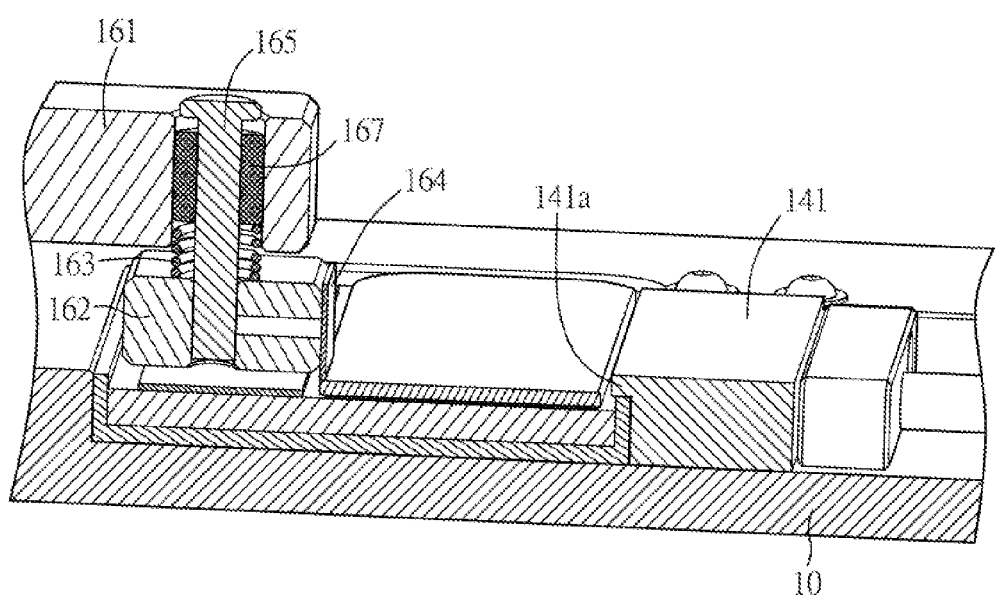

Please refer to FIGS. 1A-2. FIG. 1A is a perspective schematic view showing a detaching equipment according to an embodiment of the present invention, FIG. 1B is another perspective schematic view showing a detaching equipment according to an embodiment of the present invention, and FIG. 2 is partially enlarged cross-sectional drawing showing the detaching equipment in FIG. 1.

Figure 3:
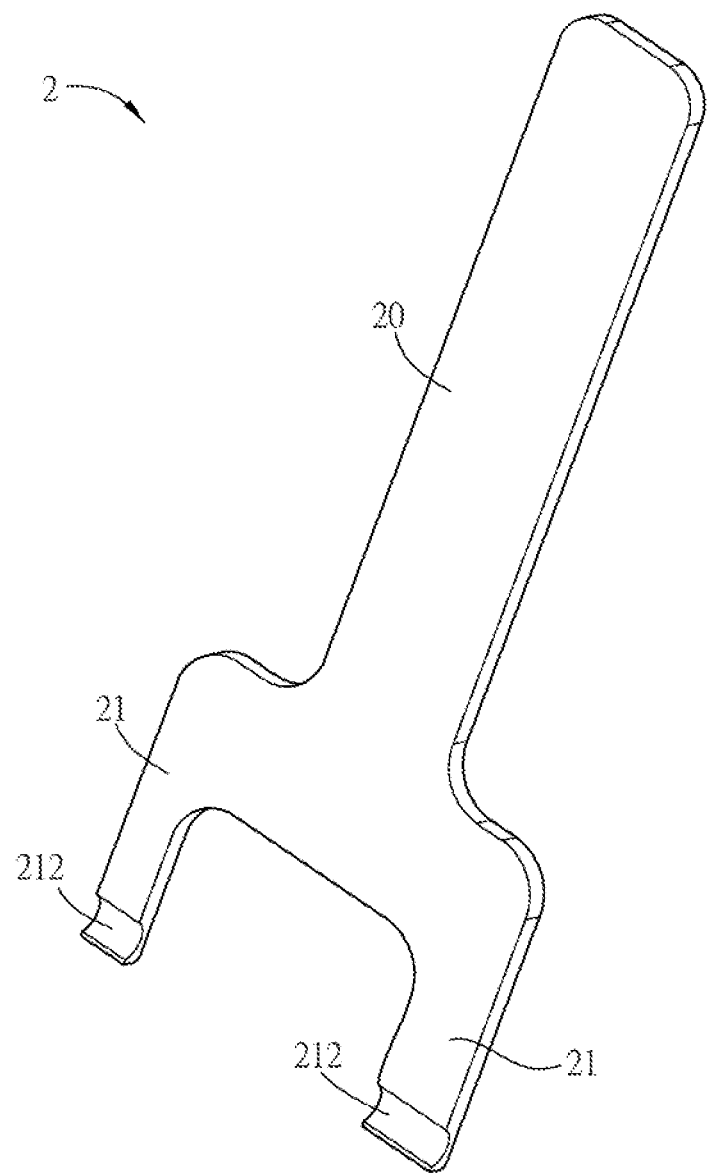
FIG. 3 is a perspective schematic view showing a pry bar that cooperates with a detaching equipment of an embodiment of the present invention.

The equipment 1 of the present invention comprises a base 10, a first fixing unit 14, a second fixing unit 16 and a pry bar 2 in which the pry bar 2 is preferred to FIG. 2 or FIG. 3.

The base 10 comprises a bearing groove 12 for bearing an electronic device 18. The shape of the bearing groove 12 is approximately the same as the appearance of the electronic device to be borne. Furthermore, the bearing groove 12 comprises a plurality of hollowed grooves 122 disposed, but not limited to, the position shown in the figure. For example, the hollowed grooves can be disposed at two sides symmetrical to a long edge of the bearing groove 12 as shown in the figure for the user to clip conveniently through two fingers, or disposed at one of short edges of the bearing groove 12 to allow the user using one finger to insert and take the electronic device 18 out from the bearing groove 12.

The electronic device 18 of the present embodiment is, but not limited to, a cell phone. That is, the electronic device 18 also can be a tablet, a notebook, a wearable device and so on. Furthermore, the electronic device 18 as shown in the figure has removed the cover for detaching the internal members of the electronic device 18 easily. The electronic device 18 of the present embodiment comprises a motherboard 181, a battery unit 182 and a housing 183, in which the motherboard 181 and the battery unit 182 are disposed in a receiving space (not shown in the figure) of the housing 183. The other members of the electronic device 18 will be omitted and are not shown in the figure. The battery unit 182 of the present embodiment is fixed on a substrate (nor shown in the figure) of the electronic device 18. For example, the battery unit 182 can be fixed to the substrate if the electronic device 18 by means of the adhesion.

Please continually refer to FIGS. 1A-2, the first fixing unit 14 and the second fixing unit 16 are disposed at the base 10. The appearance of the first fixing unit 14 is a rectangular massive member disposed at a sliding rail (not shown in the figure) of the base 10. The first fixing unit 14 has a fixing member 141 capable of moving along a first direction (X direction) for fixing the housing 183 of the electronic device 18. Furthermore, the fixing member 141 of the present embodiment that faces the bearing groove 12 has a protruding portion 141A. In addition, the first fixing unit 14 further comprises a first handle 142. The first fixing unit 14 can be controlled through the first handle 142 to allow the first fixing unit 14 to move from an initial position to a fixing position along the first direction (X direction) (FIG. 1A is the fixing position, and FIG. 1B is the initial position).

Please refer to FIG. 2. When the first fixing unit 14 moves in the first direction (X direction), the fixing member 141 of the first fixing unit 14 moves in the first direction to allow the protruding portion 141A to partially cover the housing 183 of the electronic device 18. In this case, the first fixing unit 14 can provide a force in the first direction to fix the electronic device 18 at the bearing groove 12 when the electronic device 18 needs to be detached and can further strengthen the rigidity of the housing 183 by attaching the housing 183 firmly to avoid the housing 183 from the problems, such as the impact or the bend, in the detaching process.

Please continually refer to FIG. 1A and FIG. 1B. The second fixing unit 16 of the present embodiment comprises a baffle 164 for protecting the motherboard 181 and other circuit components from the damage caused by the impact in the detaching process. The baffle 164 is able to move along the second direction (Y direction) that is perpendicular to the first direction (X direction).

The baffle 164 of the present embodiment is screwed at the second fixing unit 16 and faces a surface of the first fixing unit 14. However, the fixing method is not limited thereto. In another embodiment, the baffle 164 can be adhered, engaged or integrated with the second fixing unit 16 to achieve the same efficiency. The baffle 164 of the present embodiment can move along the second direction (Y direction) to be inserted between the motherboard 181 and the battery unit 182 for avoiding the motherboard 181 from the impact and the possible damage caused by the battery unit 182 in the detaching process of the battery unit 182.

Furthermore, please refer to FIG. 2. The second fixing unit 16 of the present embodiment further comprises a transmission member 161 and a buffering member 163. The transmission member 161 is able to drive the buffering member 163 and the baffle 164 to move, and the buffering member 163 is disposed at the transmission member 161. When the baffle 164 is inserted between the motherboard 181 and the battery unit 183, the buffering unit 163 is disposed between the motherboard 181 and the transmission member 161.

The buffering member 163 is an elastic member, such as a spring, an elastic piece, an elastic pillar, an elastic ball or members for buffering. Please refer to FIG. 2B; the advantage of disposing the buffering member 163 is described as the following. When the baffle 164 is to be inserted between the motherboard 181 and the battery unit 182, the position of the baffle 164 may be offset to partially push the battery unit 182 so that the baffle 164 will push and compress the buffer member 163 in the second direction. As shown in the figure, the buffering member 162 is not completely compressed. The buffering member 163 still can provide a little space or moving and adjusting even though the detaching process of the battery unit 182 continues. Thus, the battery unit 182 will push the baffle 164 to move toward the second direction after the battery unit 182 is pried completely for avoiding the battery unit 182 from bending and deforming caused by the restriction of the baffle 164.

Please continually refer to FIG. 2. The second fixing unit 16 further comprises a connecting member 165. The connecting member 165 is a pillar, such as a bolt. The connecting member 165 passes through the transmission member 161 and the buffering member 163. The second fixing unit 15 further comprises a pushing member 162, and the baffle 164 is screwed at the pushing member 162 and faces a surface of the first fixing unit 14. The connecting member 165 passes through the pushing member 162 to allow the transmission member 161 to drive the connecting member 165, the buffering member 163, the pushing member 162 and the baffle 164 to move along the second direction. That is, the transmission member 161 drives the pushing member 162 to move by the connecting member 165.

The second fixing unit 16 further comprises at least one positioning member 166. The at least one positioning member 166 is disposed at the base 10 and passes through the transmission member 161 to allow the transmission member 161 to move along the positioning member 166 in the second direction. The at least one positioning member 166 of the present embodiment can be two positioning member 166, and the two positioning member 166 pass, respectively, through two sides of the transmission member 161. The transmission member 161 moves along the positioning member 166 in the second direction. The advantage of disposing the positioning member 166 in the present embodiment is to fix and ensure the transmission member 161 to move in the predetermined route.

Figure 4A:
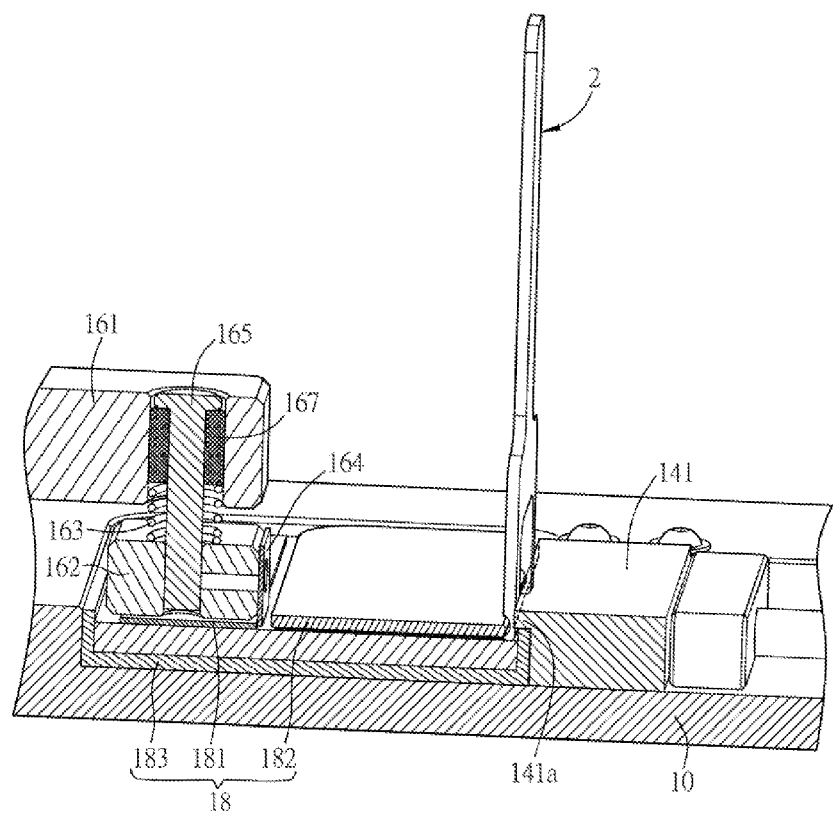
FIG. 4A-4B are schematic drawings showing an operation of utilizing a detaching equipment according to the present invention to detach a battery unit of an electronic device.
Figure 4B:
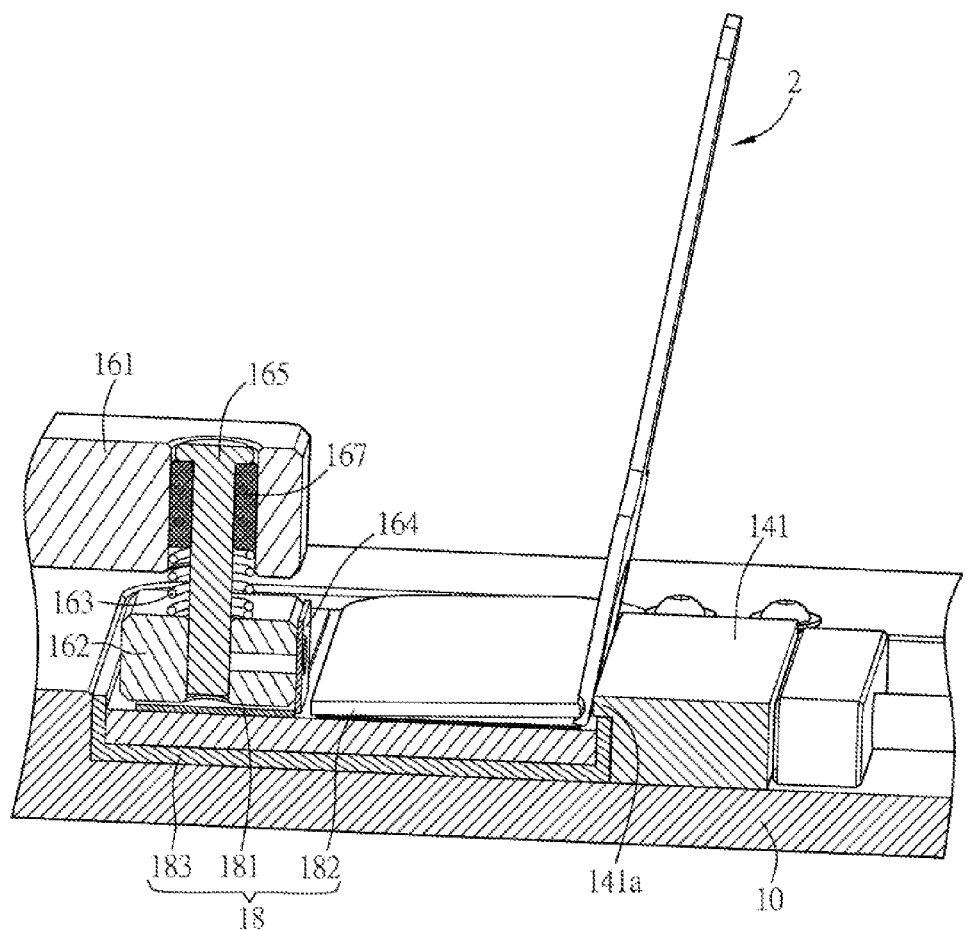

Please further refer to FIGS. 3~4B. FIG. 3 is a perspective schematic view showing a pry bar that cooperates with a detaching equipment of an embodiment of the present invention, and FIG. 4A~4B are schematic drawings showing an operation of utilizing a detaching equipment according to the present invention to detach a battery unit 182 of an electronic device 18.

The detaching equipment 1 of the present embodiment further comprises a pry bar 2. The pry bar 2 comprises at least one lifting portion 21, and the lifting portion 21 has an arc 212. In addition, the pry bar 2 of the present embodiment further comprises a grip portion 20. The at least one lifting portion 21 can be two lifting portions 21 disposed at an end of the grip portion 20. Furthermore, the widths of the two lifting portions 21 are different. The configuration of the above widths and the distance between the two lifting portions 21 will be different according to the different electronic device to be detached so that the present invention is not limited thereto. In addition, in another aspect, the pry bar 2 can has only one lifting portion and is not limited to the two lifting portions described in the present embodiment.

Figure 5:
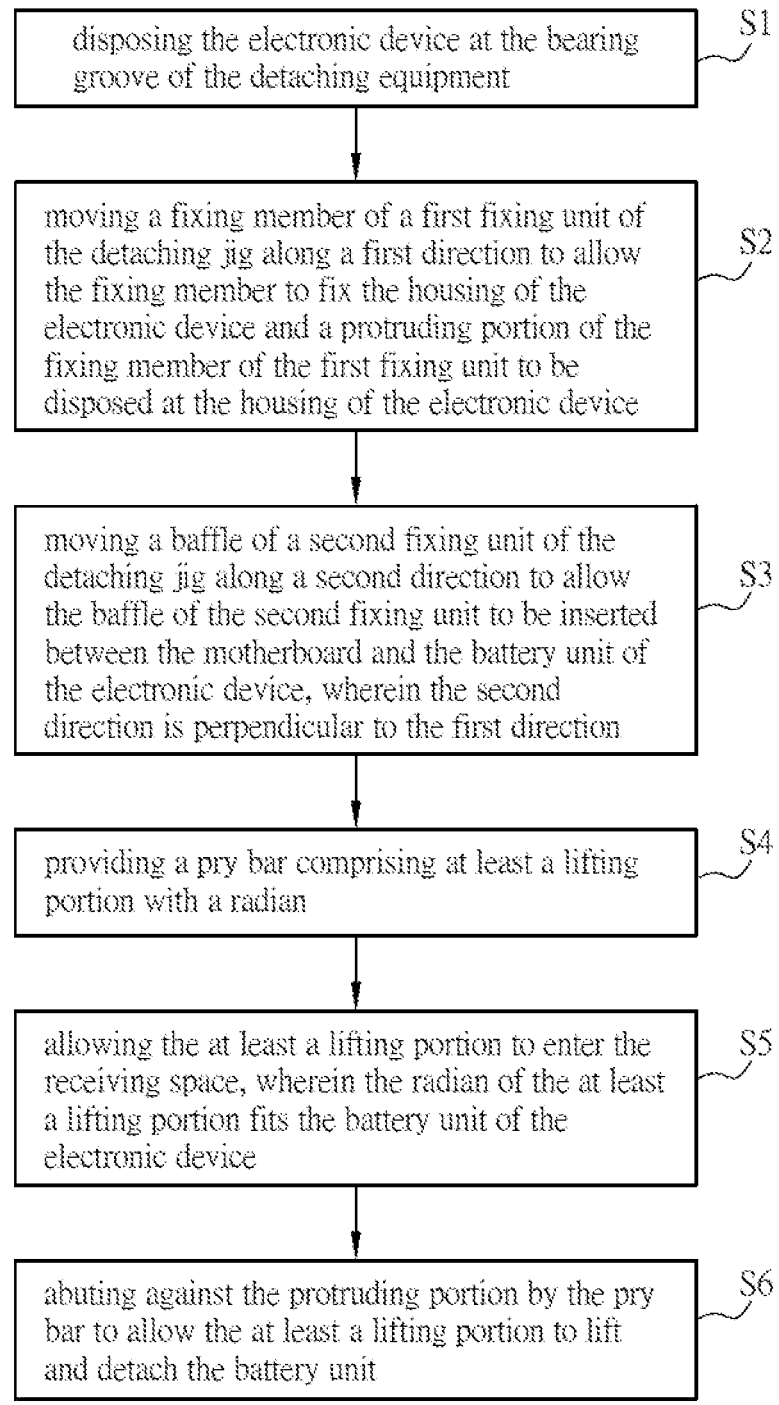
FIG. 5 is a flow chart of a detaching method of the present invention for detaching an electronic device.

The arc 212 of the end of each of the lifting portions 21 in the present embodiment will be slightly protrusive for cooperating with the electronic device to be detached. Taking the present embodiment as an example, the arc in this case is cooperated with a side arc of the battery unit 182 of the electronic device 18 so that the lifting portions 21 can be allowed to enter the receiving space, which is between the battery unit 182 and the fixing member 141 of the first fixing unit 14, of the electronic device 18 in the practical operation. The arc of each lifting portion 21 fits the side arc of the battery unit 182 of the electronic device 18 to allow the at least one lifting portion 21 of the pry bar 2 to fit the battery unit 182 and partially insert into the underneath of the battery unit 182. At that time, the grip portion 20 of the pry bar 2 is able to abut against the protruding portion 141A of the fixing member 141 that is utilized as a fulcrum. By the lever rule, the battery unit 182 is lifted and departs away from a substrate of the electronic device 18. Because the protruding portion 141 partially covers the housing 183, the pry bar 2 will not contact the housing of the electronic device 18 directly when it needs to detach the battery unit 182 through the pry bar 2 so as to reduce the damage of the baked painting of the housing 183 in the detaching process of the battery unit 182 and the deformation thereof. Finally, please refer to FIG. 5, which is a flow chart of a detaching method of the present invention for detaching an electronic device. However, the detaching method of FIG. 5 is not limited to be achieved by the above detaching equipment.

The detaching method disclosed in the present embodiment for detaching the electronic device comprises the following steps: First, the electronic device is placed at the bearing groove of the detaching equipment (step S1).

The fixing member of the first fixing unit of the detaching equipment is then moved along the first direction to allow the fixing member to fix the housing of the electronic device and the protruding portion of the fixing member of the first fixing unit to be disposed at the housing of the electronic device (step S2). The protruding portion of the fixing member of the first fixing unit can partially cover the housing of the electronic device for fixing the housing and protecting the housing in the following detaching process.

The baffle of the second fixing unit of the detaching equipment is moved along the second direction to allow the baffle of the second fixing unit to be inserted between the motherboard and the battery unit of the electronic device. The second direction is perpendicular to the first direction (step S3). The first direction of the present embodiment is X direction and the second direction is T direction. In addition, the order of the step S2 and the step S3 is not limited thereto. That is, the step S3 can be performed first (that is, the force in the second direction is provided at first) and then the step S2 is performed (that is, the force in the first direction is then provided).

When the electronic device is fixed, the pry bar is provided. The pry bar comprises at least one lifting portion, and the at least one lifting portion has an arc (step S4). The appearance of the pry bar can be referred to FIG. 3. However, the present invention is not limited to the embodiment of FIG. 3.

The at least one lifting portion is allowed to enter the receiving space, in which the arc of the at least one lifting portion fits the battery unit of the electronic device (step S5). The pry bar abuts against the protruding portion to allow the at least one lifting portion to lift and detach the battery unit (step S6). Because the pry bar does not abut against the housing of the electronic device but the protruding potion, the housing will not be deformed in the detaching process.

Accordingly, the present invention allows the electronic device to be fixed in the bearing groove of the base through the first fixing unit for avoiding the electronic device from sliding during the detaching process to further damage other circuit components.

In addition, the present invention utilizes the protruding portion of the fixing member of the first fixing unit to partially cover the housing of the electronic device for avoiding the housing from the damage caused by the pry bar during the detaching process. Furthermore, the present invention further utilizes the baffle to avoid the motherboard from the impact caused by the lift of the pry bar when the pry bar detaches the battery unit.

To sum up, the present invention is able to provide a detaching equipment for quickly detaching the electronic device without the damage of the battery, the internal members or the housing of the electronic device and a detaching method for detaching the electronic device. In addition, the structure of the detaching equipment provided in the present invention is simple and able to reduce the equipment cost of the detection workstation.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A detaching equipment for detaching an electronic device, wherein the electronic device comprises a housing, a motherboard and a battery unit in which the battery unit and the motherboard are disposed in parallel in a receiving space of the housing, comprising:
    a base having a bearing groove for bearing the electronic device;
    a first fixing unit disposed at the base and comprising a fixing member capable of moving along a first direction to fix the housing of the electronic device, wherein the fixing member has a protruding portion, and the protruding portion faces the bearing groove and partially covers the housing of the electronic device when the fixing member fixes the housing of the electronic device;
    a second fixing unit disposed at the base and comprising a baffle capable of moving along a second direction to be inserted between the motherboard and the battery unit, wherein the second direction is perpendicular to the first direction; and
    a pry bar comprising at least one lifting portion with an arc, wherein the arc of the at least one lifting portion fits the battery unit of the electronic device when the at least one lifting portion enters the receiving space and the pry bar abuts against the protruding portion to allow the at least one lifting portion to lift and detach the battery unit.

2. The detaching equipment according to claim 1, wherein the second fixing unit further comprises a transmission member and a buffering member disposed at the transmission member, and the buffering member is disposed between the motherboard and the transmission member when the baffle is inserted between the motherboard and the battery unit.

3. The detaching equipment according to claim 2, wherein the second fixing unit further comprises a connecting member passing through the transmission member and the buffering member.

4. The detaching equipment according to claim 3, wherein the second fixing unit further comprises a pushing member and the connecting member passes through the pushing member to allow the transmission member to drive the connecting member, the pushing member and the buffering member to move along the second direction.

5. The detaching equipment according to claim 2, wherein the buffering member is an elastic member.

6. The detaching equipment according to claim 2, wherein the base further comprises at least one positioning member the at least one positioning member is disposed at the base and passes through the transmission member to allow the transmission member to move along the at least one positioning member in the second direction.

7. The detaching equipment according to claim 6, wherein the at least one positioning member is two positioning members passing through, respectively, the two sides of the transmission member.

8. A detaching method for detaching electronic device, wherein the electronic device comprises a housing, a motherboard and a battery unit in which the battery unit and the motherboard are disposed in parallel in a receiving space of the housing, comprising following steps:
    disposing the electronic device at a bearing groove of a detaching equipment;
    moving a fixing member of a first fixing unit of the detaching equipment along a first direction to allow the fixing member to fix the housing of the electronic device and a protruding portion of the fixing member of the first fixing unit to be disposed at the housing of the electronic device;
    moving a baffle of a second fixing unit of the detaching equipment along a second direction to allow the baffle of the second fixing unit to be inserted between the motherboard and the battery unit of the electronic device, wherein the second direction is perpendicular to the first direction;
    providing a pry bar comprising at least one lifting portion with an arc;
    allowing the at least one lifting portion to enter the receiving space, wherein the arc of the at least one lifting portion fits the battery unit of the electronic device; and
    abutting against the protruding portion by the pry bar to allow the at least one lifting portion to lift and detach the battery unit.

* * * * *